(12) United States Patent
Shiraishi

(10) Patent No.: US 8,372,691 B2
(45) Date of Patent: Feb. 12, 2013

(54) METHOD OF MANUFACTURING SEMICONDUCTOR DEVICE

(75) Inventor: Akinori Shiraishi, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 419 days.

(21) Appl. No.: 12/691,818

(22) Filed: Jan. 22, 2010

(65) Prior Publication Data

US 2010/0190295 A1 Jul. 29, 2010

(30) Foreign Application Priority Data

Jan. 23, 2009 (JP) .................. 2009-012900

(51) Int. Cl.
*H01L 21/48* (2006.01)
(52) U.S. Cl. ........ 438/108; 438/109; 438/113; 438/126; 438/127; 257/E21.502
(58) Field of Classification Search .................. 438/109, 438/108, 113, 124, 126, 127; 257/E21.502
See application file for complete search history.

(56) References Cited

U.S. PATENT DOCUMENTS

| | | | |
|---|---|---|---|
| 6,930,392 B2 * | 8/2005 | Sunohara et al. | 257/758 |
| 7,183,639 B2 * | 2/2007 | Mihara et al. | 257/690 |
| 7,285,728 B2 * | 10/2007 | Sunohara et al. | 174/260 |

FOREIGN PATENT DOCUMENTS

| | | |
|---|---|---|
| JP | 2001-339011 | 12/2001 |
| JP | 2005-011874 A | 1/2005 |
| JP | 2005-209689 | 8/2005 |
| JP | 2005-217225 | 8/2005 |
| JP | 2007-287801 A | 11/2007 |

OTHER PUBLICATIONS

Japanese Office Action dated Oct. 9, 2012, 7 pages.

* cited by examiner

*Primary Examiner* — Michael Trinh
(74) *Attorney, Agent, or Firm* — Rankin, Hill & Clark LLP

(57) ABSTRACT

A method of manufacturing a semiconductor device, includes the steps of: (a) providing a support including a plane having a first region for mounting a chip thereon and a second region provided around the first region; (b) forming an insulating resin layer in a semi-curing state on the plane; (c) forming, on the insulating resin layer, a first opening portion for exposing the first region; (d) fitting a chip in the first opening portion to mount the chip on the first region; and (e) completely curing the insulating resin layer after the step (d).

19 Claims, 18 Drawing Sheets

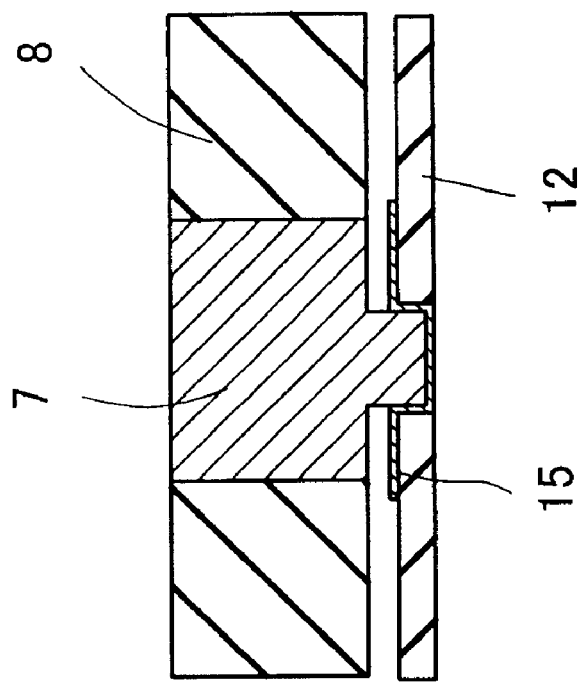
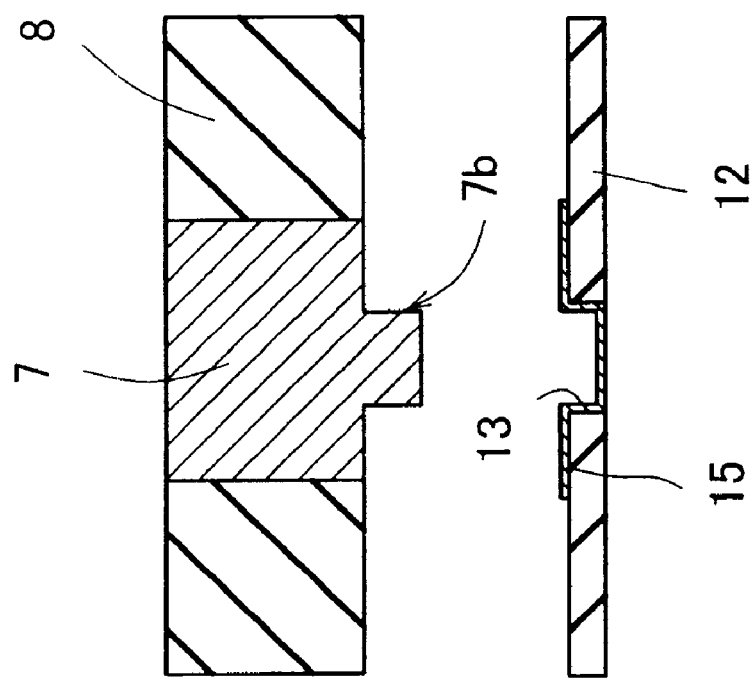
Fig. 17A
Fig. 17B

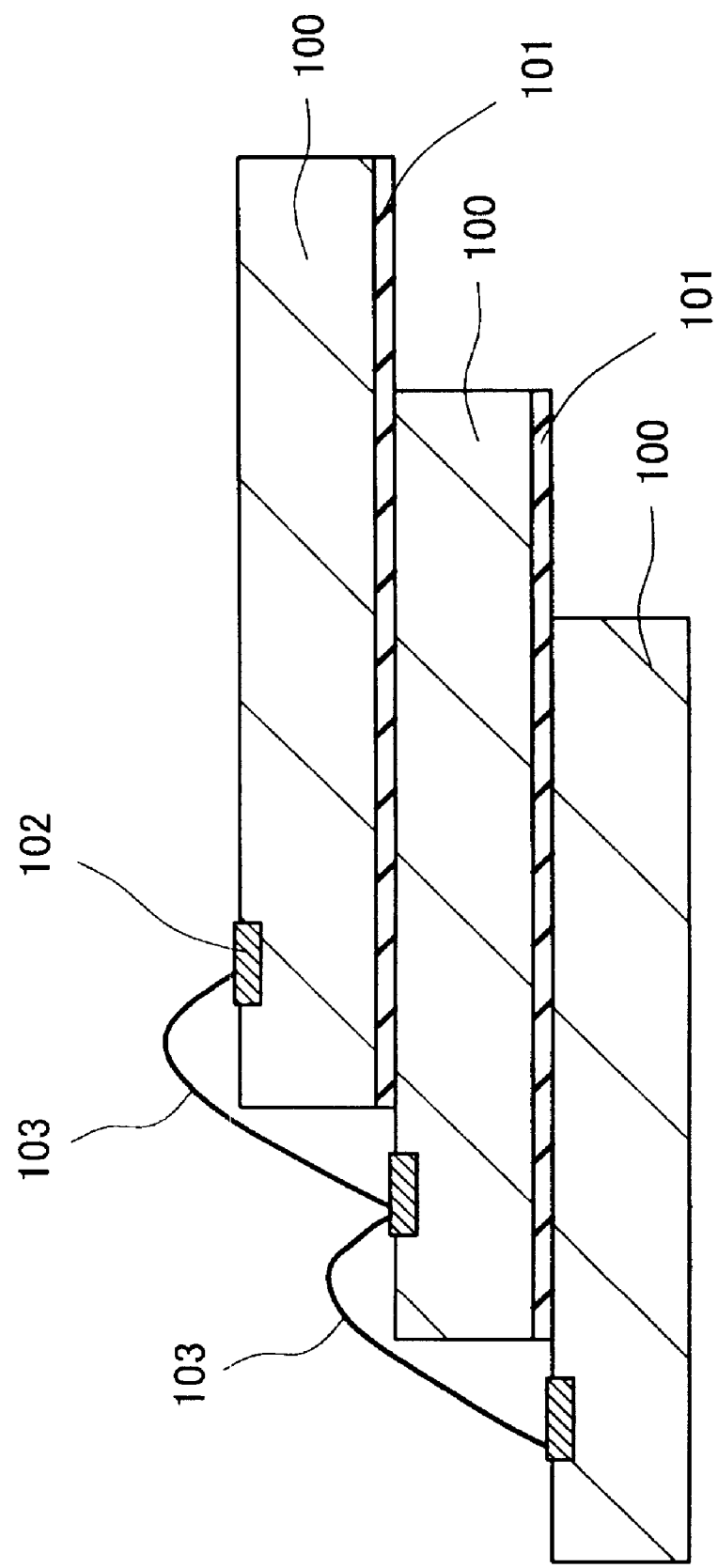

METHOD OF MANUFACTURING SEMICONDUCTOR DEVICE

This application claims priority from Japanese Patent Application No. 2009-012900, filed on Jan. 23, 2009, the entire contents of which are hereby incorporated by reference.

FIELD OF THE INVENTION

The present invention relates to a method of manufacturing a semiconductor device and more particularly to a method of manufacturing a semiconductor device having a structure in which a semiconductor chip is stacked.

DESCRIPTION OF RELATED ART

For example, a multi-chip module has been known as a semiconductor device for mounting a plurality of semiconductor chips (hereinafter referred to as chips) on a wiring board to fulfill a function. The multi-chip module has to maintain a mounting area for mounting each of the chips on the wiring board. Therefore, it is hard to reduce a size of the semiconductor device.

For example, there has been known a technique for stacking a plurality of chips as described in Patent Documents 1 to 3. Consequently, it can be supposed that the chips are not disposed but stacked on the same plane of the wiring board and the size of the semiconductor device can be thus reduced.

In respect of the reduction in the size of the semiconductor device having the stack structure, the Patent Documents 1 and 2 discloses a structure in which a via hole is formed around a chip buried in a package and conductor layers (corresponding to the "via" in the application) are formed in a connection to one of terminals and the other terminal in a conductor filled in the via hole respectively. Moreover, Patent Document 3 discloses a technique for accommodating (mounting) a semiconductor device through a gap in an opening formed on an insulating base material.

[Patent Document 1] JP-A-2005-209689
[Patent Document 2] JP-A-2005-217225
[Patent Document 3] JP-A-2001-339011

In the case in which a plurality of chips is stacked, the chip having a larger size is generally stacked in descending order, and the chip having a smaller size is stacked on the chip having the larger size. The chips are connected by carrying out wire bonding to an electrode pad (a bonding pad) provided on four sides of the chip, for example. For this reason, it is supposed that a wire length (a wiring length) of the electrode pad is increased, resulting in a disturbance of the reduction in the size of the semiconductor device.

In the case in which a plurality of chips having almost equal sizes is stacked, moreover, it is proposed to stack a chip 100 with a shift through an insulating bonding layer 101 as shown in FIG. 18. FIG. 18 is a sectional view typically showing a semiconductor device investigated by the inventor.

Since the semiconductor chip 100 is stacked with the shift, however, a size of the whole semiconductor device is larger than a chip size. Moreover, an electrode pad cannot be formed on an opposite side (a right side in FIG. 18) to a sidle (a left side in FIG. 18) on which an electrode pad 102 is formed. Therefore, the electrode pad 102 is densely provided on the side on which the electrode pad 102 can be formed. Furthermore, the chips are connected through bonding to the electrode pad 102. Therefore, a wire length (a wiring length) of a bonding wire 103 is increased so that the size of the semiconductor device is inhibited from being reduced.

SUMMARY OF INVENTION

Illustrative aspects of the present invention provide a method of manufacturing a semiconductor device capable of reducing a size of the semiconductor device in which a chip can be stacked.

According to a first aspect of the invention, a method of manufacturing a semiconductor device, includes the steps of: (a) providing a support including a plane having a first region for mounting a chip thereon and a second region provided around the first region; (b) forming an insulating resin layer in a semi-curing state on the plane; (c) forming, on the insulating resin layer, a first opening portion for exposing the first region; (d) fitting a chip in the first opening portion to mount the chip on the first region; and (e) completely curing the insulating resin layer after the step (d).

Other aspects and advantages of the invention will be apparent from the following description, the drawings and the claims.

BRIEF DESCRIPTION OF THE DRAWINGS

FIG. 18 is a sectional view typically showing a semiconductor device investigated by the inventor.

DETAILED DESCRIPTION OF EXEMPLARY EMBODIMENTS

Figure 1:
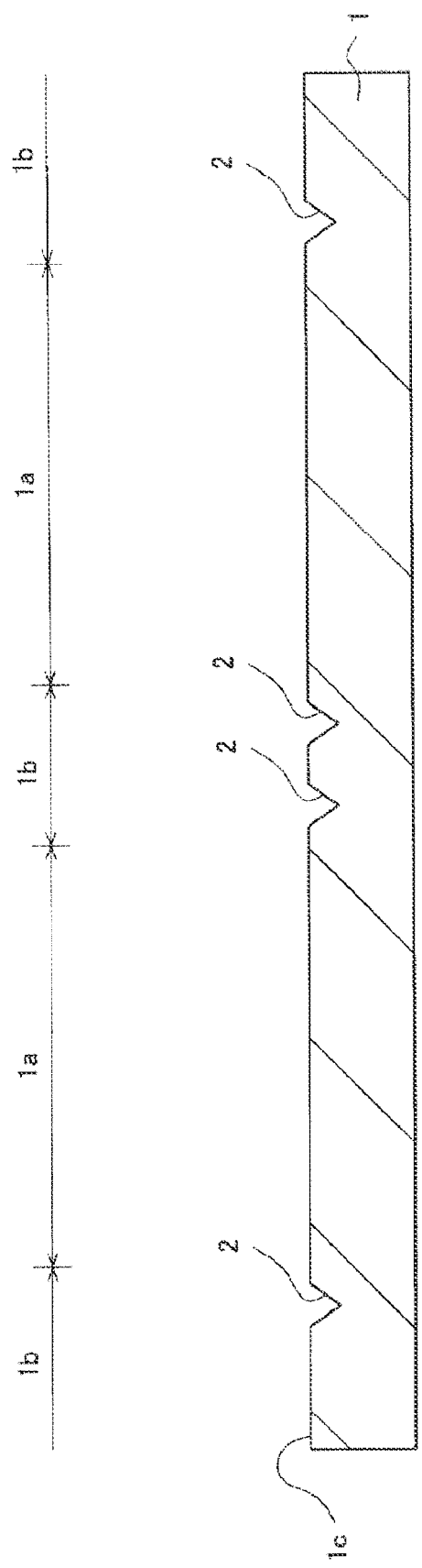
FIG. 1 is a sectional view typically showing a semiconductor device in a manufacturing process according to a first exemplary embodiment of the invention.

Exemplary embodiments according to the invention will be described below in detail with reference to the drawings. In all of the drawings for explaining the exemplary embodiments, members having the same functions have the same reference numerals and repetitive description thereof will be omitted in some cases.

First Exemplary Embodiment

A method of manufacturing a semiconductor device according to a first exemplary embodiment will be described with reference to FIGS. 1 to 13. First of all, as shown in FIG. 1, there is prepared a support 1 including a plane 1c having a chip mounting region 1a for mounting a semiconductor chip (hereinafter referred to as a chip) thereon and a peripheral region 1b outside of the chip mounting region 1a, and a concave portion 2 (a counterbore) is formed on the peripheral region 1b. Although there is shown the case in which two chips are mounted in a manufacturing process according to the exemplary embodiment, the invention is not restricted thereto but a large number of chips can be mounted depending on a chip size and a size of the plane 1c of the support 1, for example.

The support 1 serves to arrange and support a chip and preferably has a flatness and a small difference in a coefficient of thermal expansion from the chip. The chip is formed by using a semiconductor such as silicon for a base material. Accordingly, it is preferable to use a silicon substrate or a glass board for the support 1, for example. In the case in which a metal plate such as a copper plate is used as the support 1, a swell is generated. In case of the silicon substrate, however, it is possible to maintain a flatness of the plane 1c. The support 1 is used for supporting a chip and is removed when the semiconductor device is completed.

In the case in which the support 1 is formed of the silicon, the concave portion 2 can be formed by a lithographic technique and an etching technique, for example, and is processed into a desirable shape. Although the concave portion 2 taking a shape of a triangular pyramid is formed in FIG. 1, the shape of the concave portion 2 is not restricted thereto.

Figure 2:
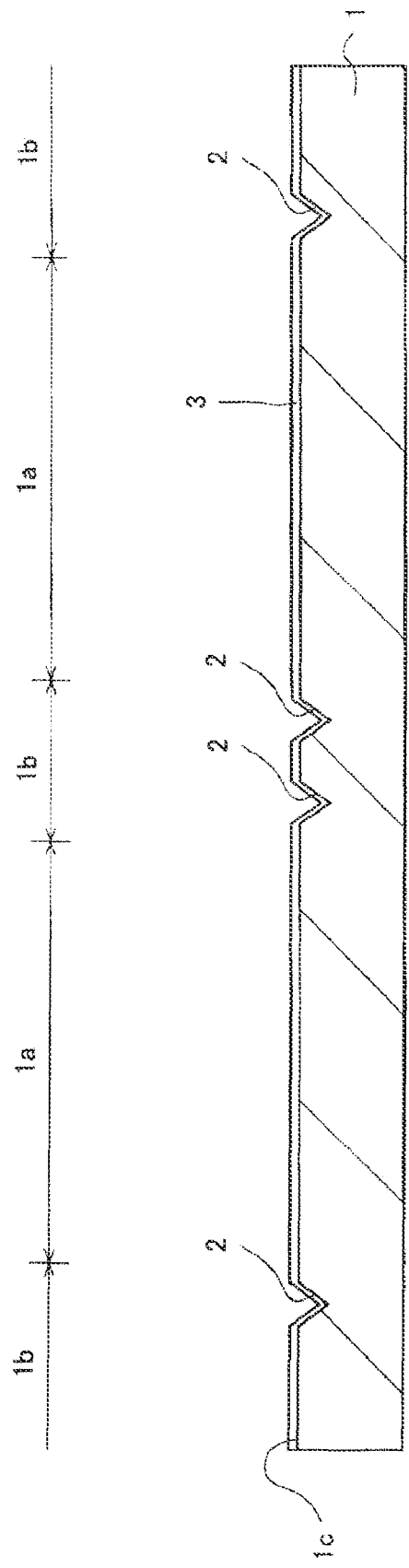
FIG. 2 is a sectional view typically showing the semiconductor device in the manufacturing process subsequently to FIG. 1.

As shown in FIG. 2, subsequently, a peeling layer 3 is formed on an inner part of the concave portion 2 and the plane 1c. The peeling layer 3 is used for removing the support 1 when the semiconductor device is completed, and an insulating resin can be applied to the peeling layer 3, for example.

Figure 3:
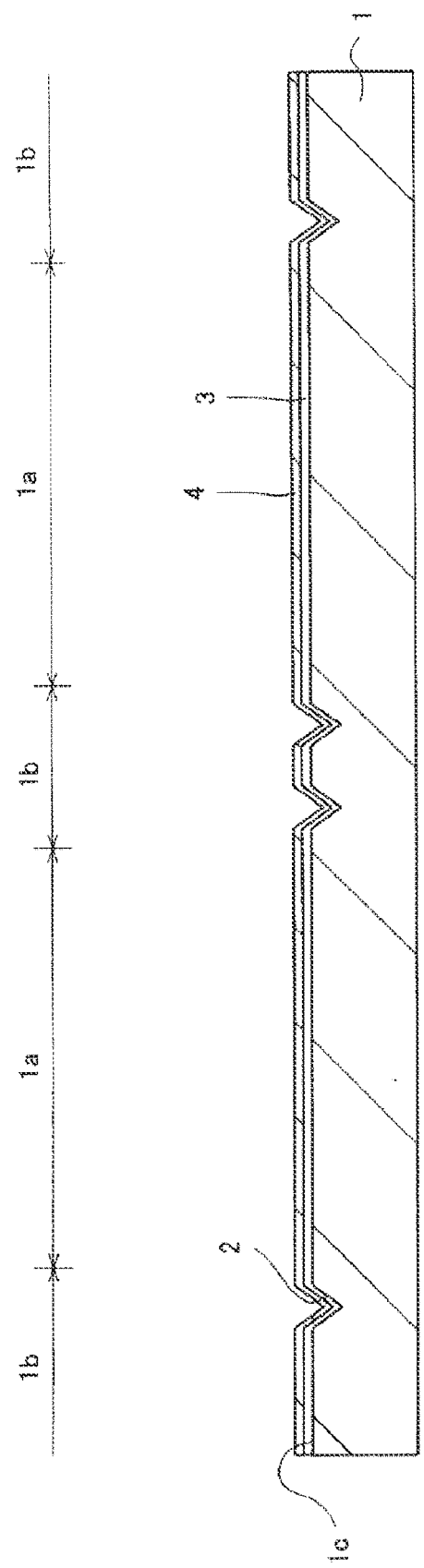
FIG. 3 is a sectional view typically showing the semiconductor device in the manufacturing process subsequently to FIG. 2.

As shown in FIG. 3, then, a conductive film 4 is formed on the inner part of the concave portion 2 and the plane 1c through the peeling layer 3. The conductive film 4 is used as a seed film at a subsequent plating step and is a copper film or a titanium film which is formed by a sputtering method, for example.

Figure 4:
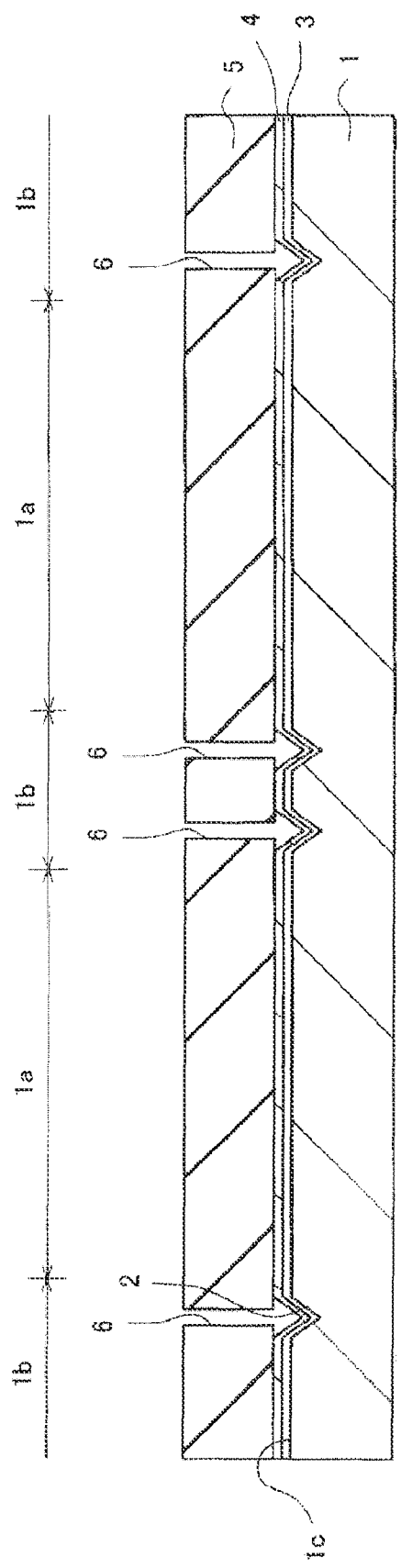
FIG. 4 is a sectional view typically showing the semiconductor device in the manufacturing process subsequently to FIG. 3.

As shown in FIG. 4, thereafter, an insulating layer 5 used as a plating resist is formed on the conductive film 4 and a hole portion 6 for exposing the conductive film 4 is then formed on the insulating film 5 in a position of the concave portion 2. The insulating layer 5 is formed by applying photosensitive polyimide onto the conductive film 4, for example. In this case, the hole portion 6 is formed by a photolithographic technique. For example, it is also possible to form the hole portion 6 in the position of the concave portion 2 by a lithographic technique using a mask in the formation of the concave portion 2.

Figure 5:
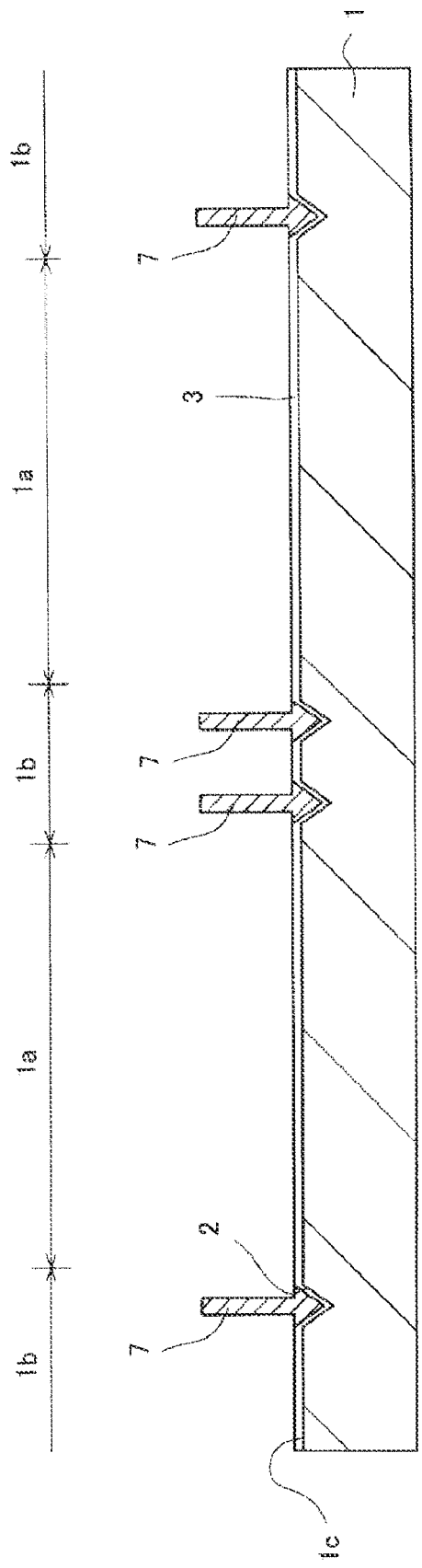
FIG. 5 is a sectional view typically showing the semiconductor device in the manufacturing process subsequently to FIG. 4.

Next, a conductive layer formed of copper is provided on the conductive film 4 of the hole portion 6 by a plating method, for example, and the insulating layer 5 and the conductive film 4 provided under the insulating layer 5 are then removed as shown in FIG. 5. In other words, a columnar conductive layer extended from the concave portion 2 toward an upper part of the plane 1c is formed in the peripheral region 1b.

The conductive layer acts as a via. A tip portion of a via 7 at the support 1 side is protruded from the plane 1c in the chip mounting region 1a. For this reason, when a chip 10 is mounted on the chip mounting region 1a at a subsequent step (for example, FIG. 7), the tip portion of the via 7 is protruded from a back face of the chip 10. The tip portion of the via 7 functions as an external connecting terminal 7a such as a so-called bump electrode in the case in which the chips 10 are stacked (for example, FIG. 14).

It is also possible to form the via 7 by inserting a conductive pin into the concave portion 2, for example. By using the plating method in the formation of the via 7, however, it is possible to form the thin via 7 in a desired position.

Figure 6:
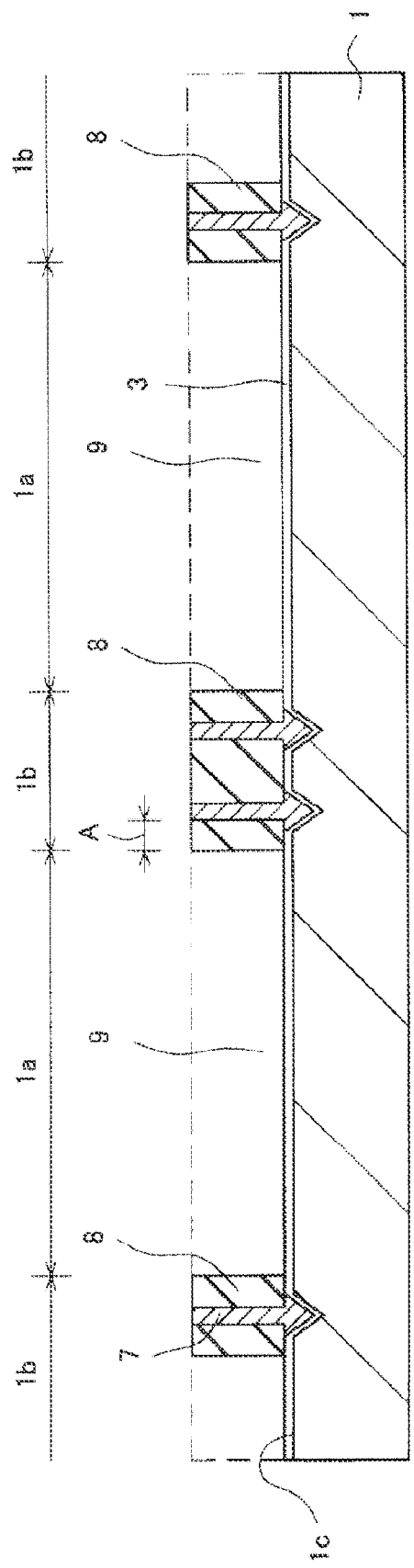
FIG. 6 is a sectional view typically showing the semiconductor device in the manufacturing process subsequently to FIG. 5.

As shown in FIG. 6, next, an insulating resin layer 8 is formed on the plane 1c in the chip mounting region 1a and the peripheral region 1b (as shown in a broken line of FIG. 6) and an opening portion 9 for opening the chip mounting region 1a is then formed on the insulating resin layer 8. Consequently, the insulating resin layer 8 having the opening portion 9 is formed on the plane 1c to envelop a side surface of the via 7. In other words, the insulating resin layer 8 having the opening portion 9 is formed to surround the chip mounting region 1a. For a resin material of the insulating resin layer 8, it is possible to use an epoxy resin and a polyimide resin.

In the case in which a solder resist such as the epoxy resin is used for the insulating resin layer 8 as an example of a photosensitive resin, it can be semi-cured at a lower temperature (for example, approximately 140 to 150° C.) than a temperature (for example, approximately 170 to 180° C.) at which curing is completely carried out. Moreover, the opening portion 9 can be formed with high precision by the photolithographic technique and the etching technique, for example. The insulating resin layer 8 serves to protect a side surface of the chip 10 (for example, FIGS. 7 and 8).

Figure 7:
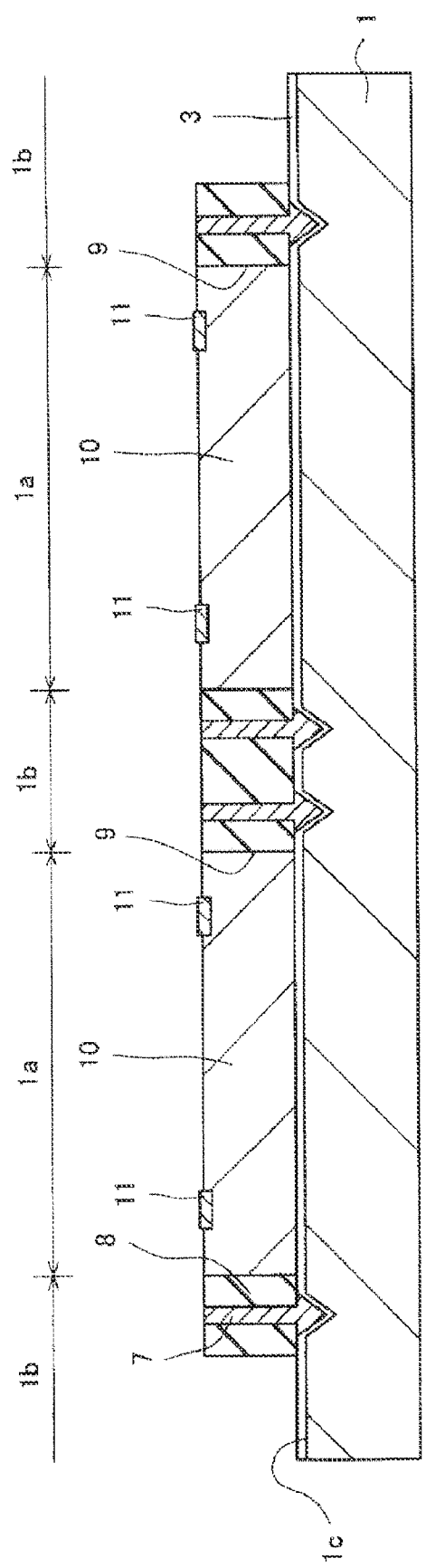
FIG. 7 is a sectional view typically showing the semiconductor device in the manufacturing process subsequently to FIG. 6.

As shown in FIG. 7, subsequently, the chip 10 is fitted in the opening portion 9 of the insulating resin layer 8, and the chip 10 is mounted on the chip mounting region 1a with the plane 1c and a back face of the plane 10 provided in contact with each other. Thereafter, the insulating resin layer 8 is completely cured. A semiconductor element (not shown) such as a transistor is formed on a main surface (a surface) of an opposite face to the back face of the chip 10, and an electrode pad 11 to be a connecting terminal which is electrically connected to the semiconductor element is formed on the main surface. In the first exemplary embodiment, the chip 10 is fitted in the opening portion 9 formed with high precision by the photolithographic technique and the etching technique. Therefore, the chip 10 can easily be mounted on the support 1 with a suppression in a positional shift.

Figure 8:
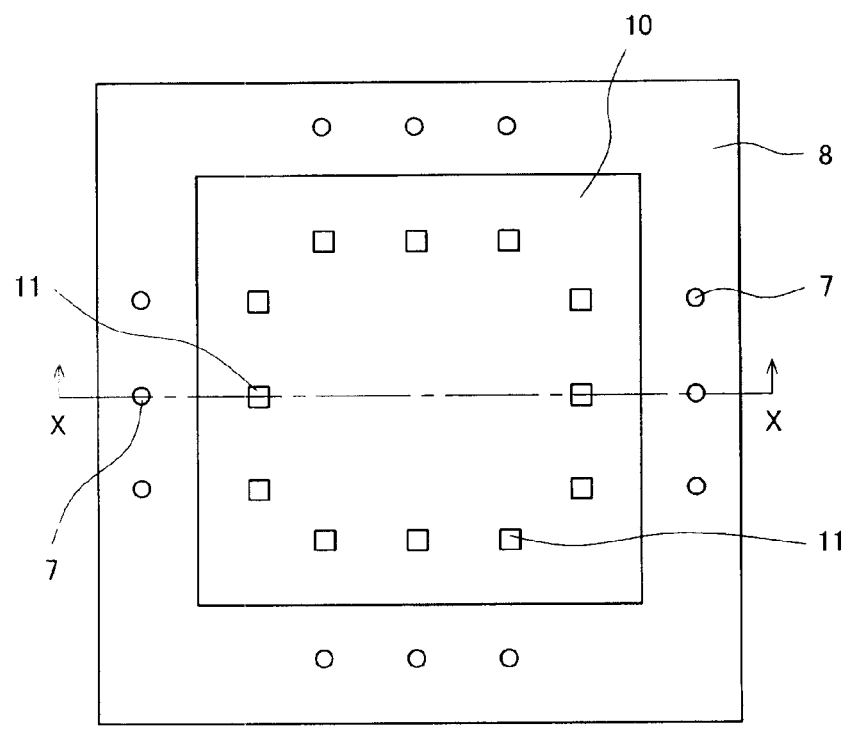
FIG. 8 is a plan view typically showing the semiconductor device in FIG. 7.

FIG. 8 is a plan view showing the chip 10 unit illustrated in FIG. 7. The insulating resin layer 8 for protecting the chip 10 is formed around the chip 10. By the insulating resin layer 8, the respective vias 7 are electrically insulated from each other and the via 7 and the chip 10 are electrically insulated from each other. In FIG. 8, a position of the chip 10 indicates the chip mounting region 1a of the support 1 and a position of the insulating resin layer 8 indicates the peripheral region 1b.

It is necessary to maintain the electrical insulation between the chip 10 to be mounted on the chip mounting region 1a and the via 7. In consideration of a semiconductor device having a small size, however, it is desired to reduce a width of the insulating resin layer 8 (shown in "A" of FIG. 6, for example) between the via 7 and the chip 10. In the first exemplary embodiment, therefore, a width capable of electrically insulating the via 7 from the chip 10 is maintained and the opening portion 9 is thus formed. In the first exemplary embodiment, moreover, a size of the opening portion 9 to be formed on the insulating resin layer 8 is set to be smaller than a size of the chip 10 in such a manner that a side surface of the opening portion 9 is provided in contact with a side surface of the chip 10.

In the case in which the insulating resin layer 8 is completely cured before the chip 10 is mounted on the support 1, the chip 10 can not be fitted in the opening portion 9 because the size of the opening portion 9 is smaller than that of the chip 10. In the first exemplary embodiment, therefore, the insulating resin layer 8 (the solder resist) is set into a semi-curing state in a formation thereof and is completely cured after the chip 10 is fitted in the opening portion 9 and is then mounted on the support 1. Furthermore, the insulating resin layer 8 (the solder resist) has an adhesive property in the semi-curing state. Therefore, a side surface of the opening portion 9 formed on the insulating resin layer 8 is bonded to a side surface of the chip 10.

Figure 9:
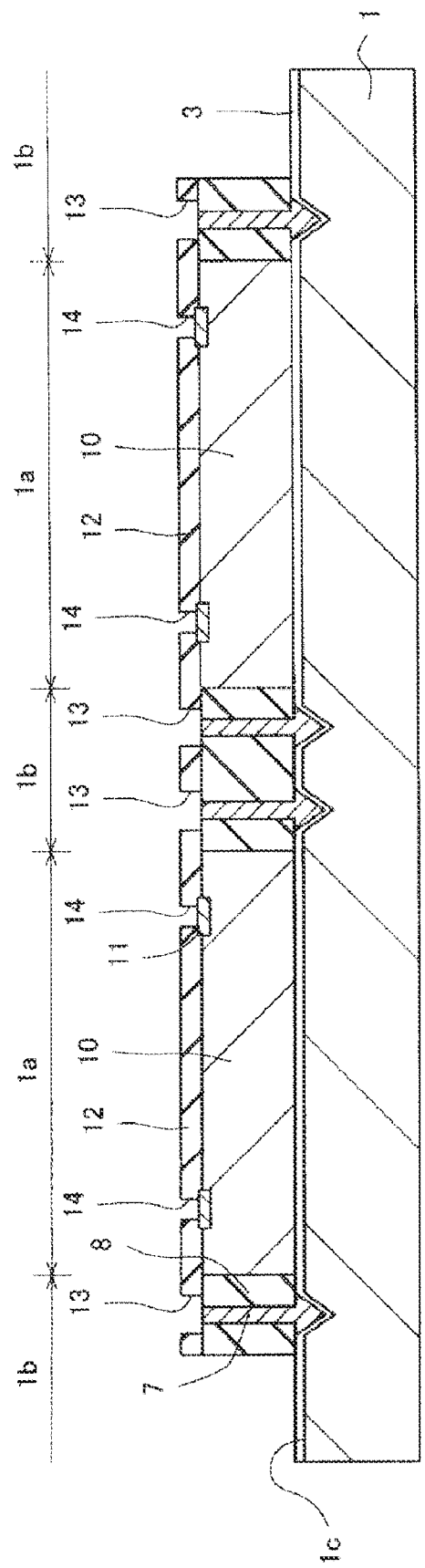
FIG. 9 is a sectional view typically showing the semiconductor device in the manufacturing process subsequently to FIG. 7.

As shown in FIG. 9, subsequently, an insulating layer 12 is formed to cover the via 7 and the chip 10 and an opening portion 13 and an opening portion 14 are formed on the insulating layer 12 by the photolithographic technique. The opening portions 13 and 14 expose the via 7 and the electrode pad 11 of the chip 10 respectively and take a columnar shape, for example. An epoxy resin or a polyimide resin is used for the insulating layer 12. The insulating layer 12 serves to protect a surface of the chip 10.

Figure 14:
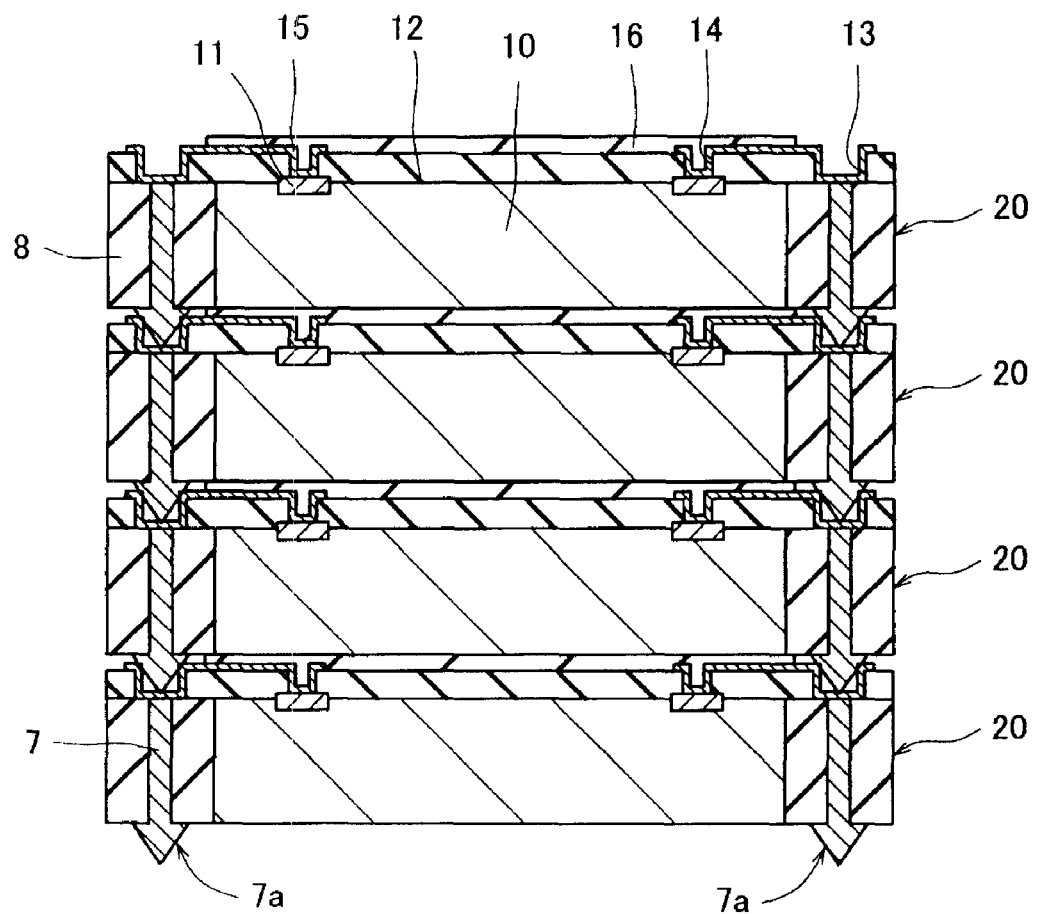
FIG. 14 is a sectional view typically showing a semiconductor device in a manufacturing process according to a second exemplary embodiment of the invention.

The opening portion 14 preferably has such a size that a connection of the electrode pad 11 of the chip 10 to a wiring layer 15 to be formed at a subsequent step (for example, FIG. 10) can be maintained. Moreover, the opening portion 13 preferably has such a size that a connection of the via 7 to the wiring layer 15 to be formed at the subsequent step can be maintained and a tip portion of the via 7 can be fitted in the opening portion 13 when the chip 10 is stacked as shown in FIG. 14. The size of the opening portion 14 is smaller than that of the opening portion 13.

The insulating layer 12 is formed by printing using a solder resist constituted by an epoxy resin, for example. In the first exemplary embodiment, the insulating resin layer 8 constituted by the solder resist is completely cured before the formation of the insulating layer 12. In the case in which the solder resist is used for the insulating layer 12, however, the insulating resin layer 8 can also be cured completely together with the insulating layer 12. Thus, it is possible to simplify the step.

Figure 10:
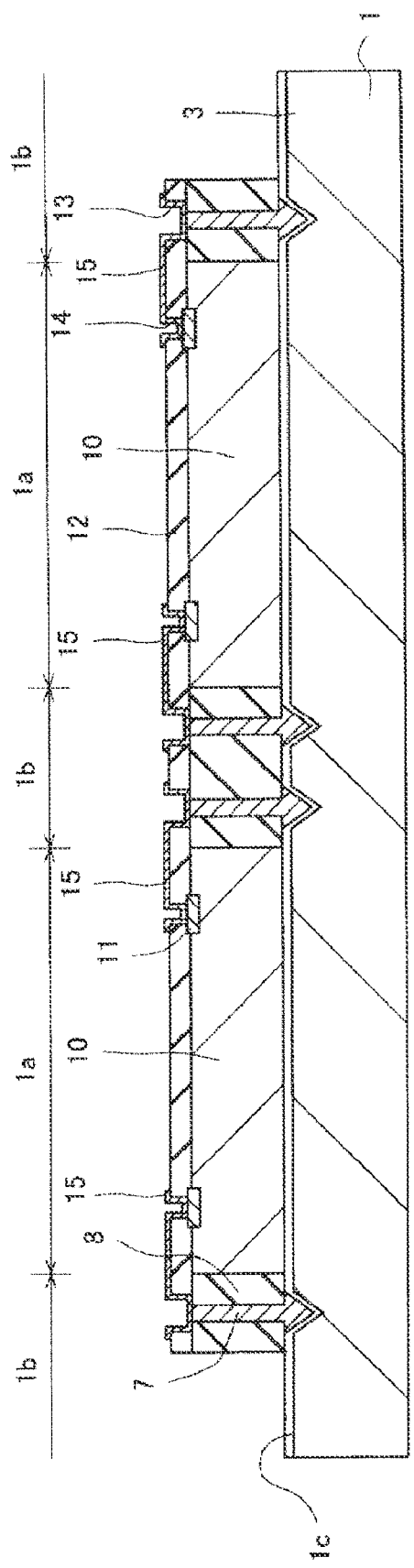
FIG. 10 is a sectional view typically showing the semiconductor device in the manufacturing process subsequently to FIG. 9.

As shown in FIG. 10, next, the wiring layer 15 for electrically connecting the electrode pad 11 to the via 7 is formed on inner parts of the opening portions 13 and 14 and the insulating layer 12. The wiring layer 15 is formed by a semi-additive method, for example. The wiring layer 15 is formed as a rewiring (for example, FIGS. 12 and 13). In the first exemplary embodiment, the width (shown in "A" of FIG. 6, for example) of the insulating resin layer 8 between the via 7 and the chip 10 can be reduced. Therefore, it is possible to reduce a length of the wiring layer 15 provided from the electrode pad 11 to the via 7.

Figure 11:
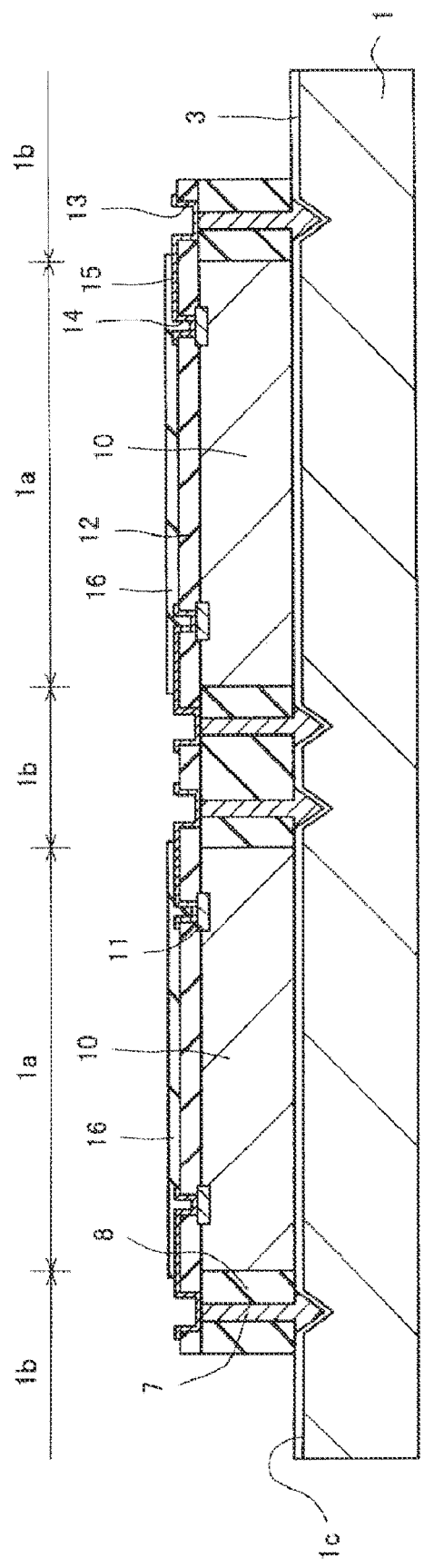
FIG. 11 is a sectional view typically showing the semiconductor device in the manufacturing process subsequently to FIG. 10.

As shown in FIG. 11, then, an insulating bonding layer 16 is formed on the insulating layer 12 to expose the wiring layer 15 of the opening portion 13 and to embed the opening portion 14 on which the wiring layer 15 is provided. A bonding layer composed of a resin such as epoxy resin or polyimide is used as the bonding layer 16. More specifically, the bonding layer 16 is pressure bonded to cover the chip 10. By using the bonding layer 16 which is thicker than a depth of the opening portion 14, the opening portion 14 is embedded with the bonding layer 16. Consequently, it is possible to prevent a defect such as a corrosion of the wiring layer 15. A plurality of the chips 10 are bonded to each other through the bonding layer 16 when the chips 10 are to be stacked, which will be described below.

Figure 12:
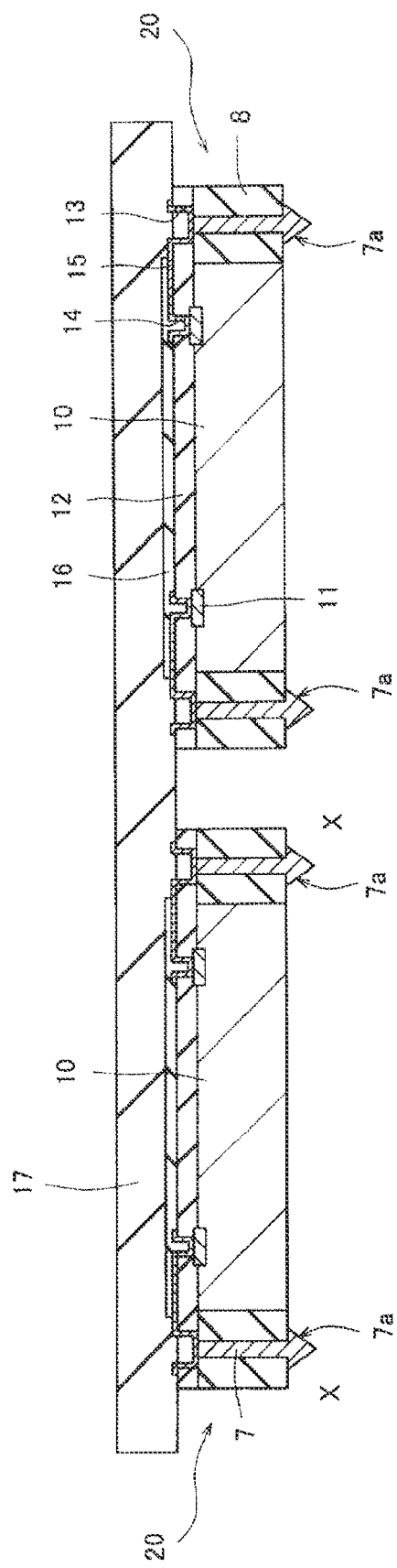
FIG. 12 is a sectional view typically showing the semiconductor device in the manufacturing process subsequently to FIG. 11.

Thereafter, a dicing tape 17 is stuck onto the chip 10 at an opposite side to the support 1. As shown in FIG. 12, subsequently, the support 1 is separated from the chip 10, the via 7 and the insulating resin layer 8, and the insulating resin layer 8 and the insulating layer 12 between the chips 10 are cut so that a semiconductor device 20 is obtained. Next, the semiconductor device 20 is taken out of the dicing tape 17.

Figure 13:
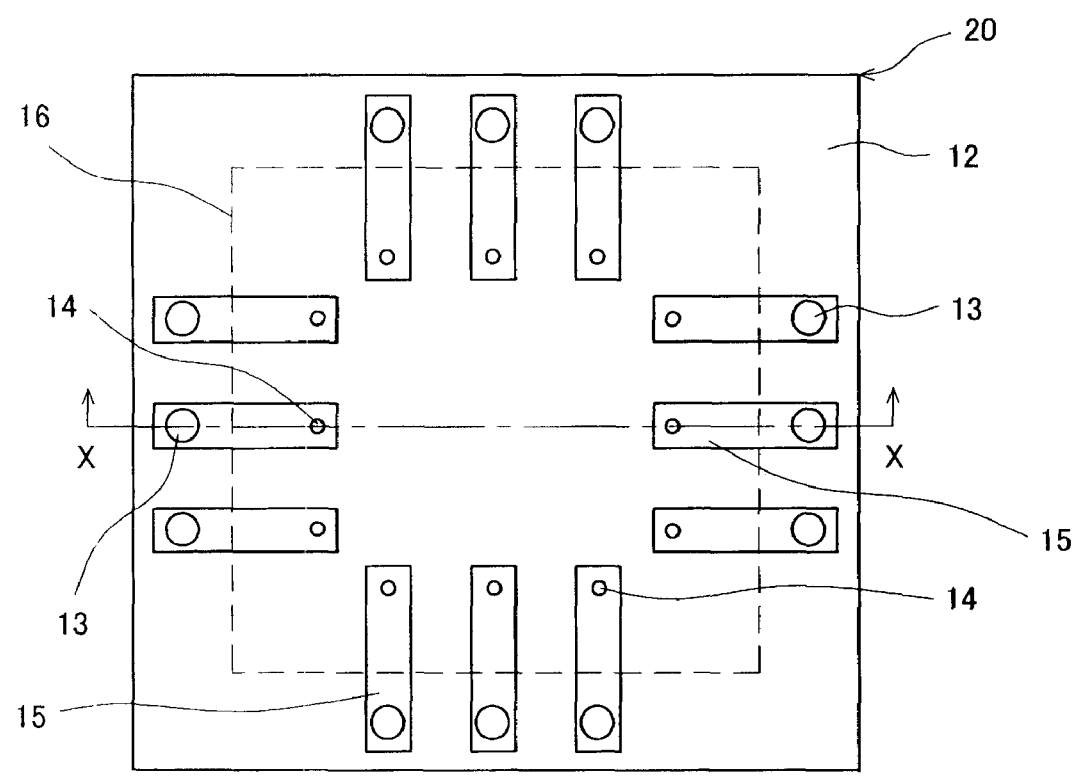
FIG. 13 is a plan view typically showing the semiconductor device in FIG. 12.

FIG. 12 shows a state in which the dicing tape 17 is expanded after dicing. FIG. 13 is a plan view showing the chip 10 divided into an individual piece in FIG. 12, illustrating a state in which the bonding layer 16 (a circumference thereof is shown in a broken line) is seen through. The chip 10 is divided into the individual piece with main and side surfaces having protecting layers (the insulating resin layer 8 and the insulating layer 12).

In other words, the chip 10 to be a core is subjected to packaging by the protecting layers and acts as the semiconductor device 20 having a CSP (Chip Size Package) structure. In the semiconductor device 20 having the CSP structure, the electrode pad 11 and the external connecting terminal 7a to be the tip portion of the via 7 are electrically connected through the wiring layer 15 (the rewiring) provided over the insulating layer 12 formed on the main surface side of the chip 10. The external connecting terminal 7a is protruded to be a bump. Therefore, the semiconductor device having the CSP structure can also be stacked as the chip 10.

Referring to a method of manufacturing a semiconductor device according to the first exemplary embodiment, first of all, the insulating resin layer 8 is formed in a semi-curing state on the plane 1c of the support 1 to envelop the side surface of the via 7. Subsequently, the opening portion 9 for exposing the chip mounting region 1a is formed on the insulating resin layer 8 and the chip 10 is then fitted in the opening portion 9, and the chip 10 is thus mounted on the chip mounting region 1a. Next, the insulating resin layer 8 is completely cured. Consequently, the chip 10 is fitted in the opening portion 9 formed on the insulating resin layer 8 having the width for maintaining the insulating properties of the chip 10 and the via 7. Thus, it is possible to reduce a size of the semiconductor device. In addition, it is possible to mount the chip 10 without a positional shift.

In the semiconductor device 20 having the CSP structure according to the first exemplary embodiment, thus, the via 7 is formed around the chip 10 and the electrical connection of the chip 10 and the via 7 is carried out through the wiring layer 15. As described above, the via 7 is formed in the peripheral region 1b of the support 1 and the chip 10 is then mounted on the chip mounting region 1a.

In the first exemplary embodiment, the opening portion 9 can be formed on the insulating resin layer 8 with high precision by the photolithographic technique and the etching technique, and the chip 10 is fitted in the opening portion 9. Therefore, the positional shift of the chip 10 can be suppressed and the chip 10 can be mounted on the support 1 with high precision, and furthermore, the connection to the via 7 can also be carried out with high precision. In order to mounting the chip 10 on the support 1 with high precision, the insulating resin layer 8 is set into the semi-curing state in the formation and is completely cured after the chip 10 is fitted in the opening portion 9 and is thus mounted on the support 1.

Second Exemplary Embodiment

In the second exemplary embodiment, description will be given to a semiconductor device obtained by stacking, in four stages, a plurality of semiconductor devices having a CSP structure which is formed by repeating the steps described in the first exemplary embodiment. Repetitive description of the first exemplary embodiment will be omitted.

Figure 16A:
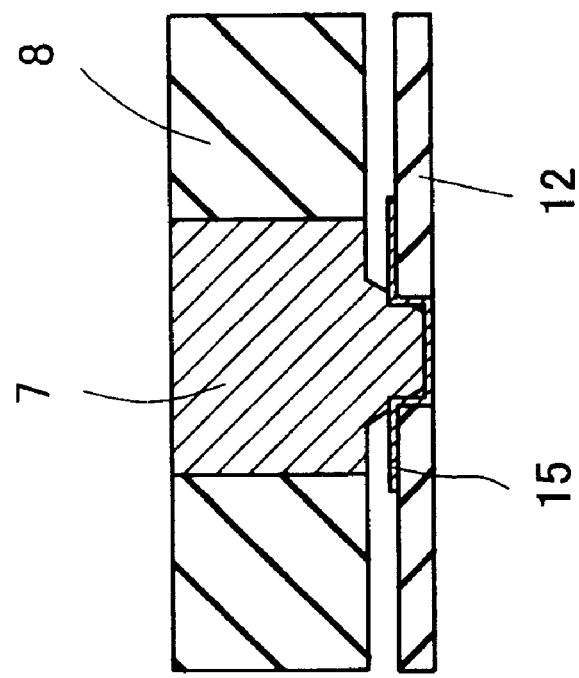
FIGS. 16A and 16B are sectional views typically showing a main part of the semiconductor device in the manufacturing process according to the second exemplary embodiment of the invention, steps proceeding in order of FIG. 16A and FIG. 16B, FIGS. 17A and 17B are sectional views typically showing a main part of the semiconductor device in the manufacturing process according to the third exemplary embodiment of the invention, steps proceeding in order of FIG. 17A and FIG. 17B.
Figure 16B:
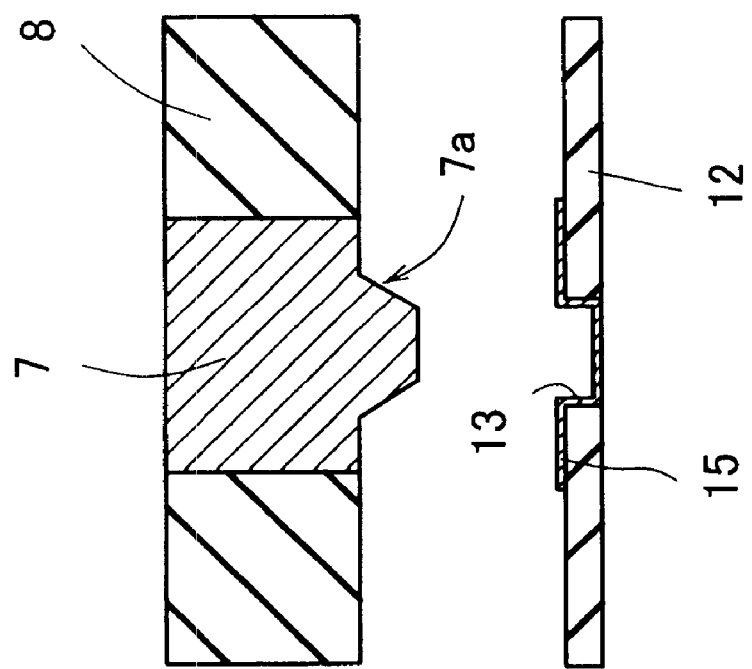

As shown in FIG. 14 and FIGS. 16A and 16B illustrating a main part of FIG. 14 which is enlarged, a semiconductor device 20 in an upper stage and that in a lower stage are pushed and put together. Consequently, a back face of a chip 10 of the semiconductor device 20 in the upper stage comes in contact with a bonding layer 16 of the semiconductor device 20 in the lower stage. Moreover, an external connecting terminal 7a to be a tip portion of a via 7 of the semiconductor device 20 in the upper stage is fitted in (connected to) an opening portion 13 of the semiconductor device 20 in the lower stage. Consequently, it is possible to enhance a connecting property of the semiconductor devices 20 in the upper and lower stages.

Thus, the semiconductor device 20 in the upper stage and the semiconductor device 20 in the lower stage are stacked. In the same manner, the semiconductor devices 20 are stacked into four stages. Then, the stacked semiconductor devices 20 are heated so that the bonding layer 16 is cured and the respective semiconductor devices 20 are fixed to each other.

The external connecting terminal 7a of the semiconductor device 20 in the upper stage is electrically connected to a wiring layer 15 in the opening portion 13 of the semiconductor device 20 in the lower stage. Moreover, the chip 10 of the semiconductor device 20 in the upper stage is electrically insulated from the wiring layer 15 of the semiconductor device 20 in the lower stage through the bonding layer 16.

By stacking the semiconductor device 20 having the CSP structure, thus, it is possible to form a stack module having a small volume. Referring to the stack module, moreover, the electrical connection between the respective chips is not carried out through a bonding wire differently from FIG. 18 but the via 7 is used. Therefore, it is not necessary to carry out the stacking with a shift every chip. Although the electrode pad 102 can be only formed on two sides in the chip 100 of FIG. 18, the external connecting terminal 7a can be formed on four sides in the semiconductor device 20 (see FIGS. 12 and 13).

A connecting part of the tip portion of the via 7 of the semiconductor device 20 in the upper stage and the opening portion 13 of the semiconductor device 20 in the lower stage may take a shape of a cone, a cylinder or a pyramid.

Figure 15:
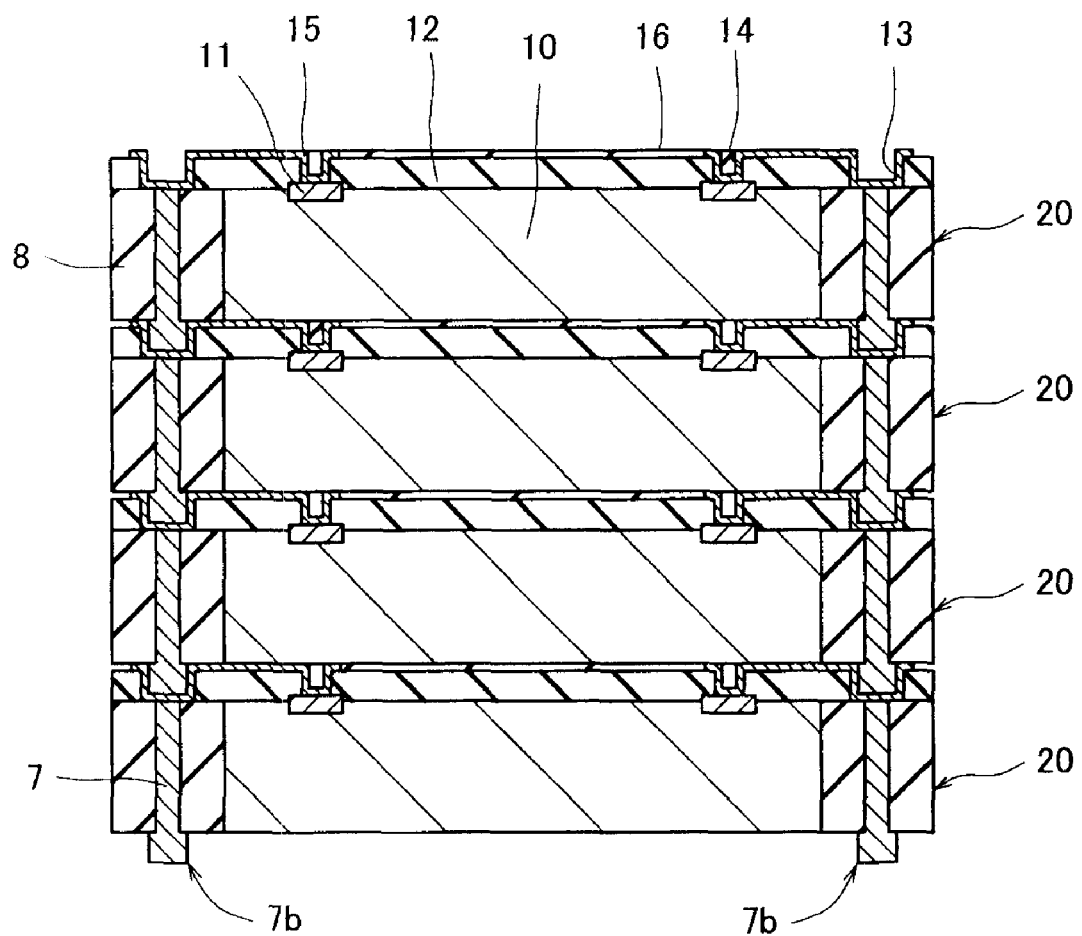
FIG. 15 is a sectional view typically showing a semiconductor device in a manufacturing process according to a third exemplary embodiment of the invention.

For example, as shown in FIG. 15 and FIGS. 17A and 17B illustrating a main part in FIG. 15 which is enlarged, the shape of the tip portion of the via 7 may be identical to the shape of the opening portion 13. Herein, an external connecting terminal 7b is formed. The external connecting terminal 7b is obtained by causing the tip portion of the via 7 to take a cylindrical shape corresponding to the cylindrical opening portion 13. Consequently, the external connecting terminal 7b to be the tip portion of the via 7 of the semiconductor device 20 in the upper stage can be fitted in (connected to) the opening portion 13 of the semiconductor device 20 in the lower stage. Thus, it is possible to enhance the connecting property of the semiconductor devices 20 in the upper and lower stages more greatly. The via 7 is Formed by a columnar conductive layer extended from a concave portion 2 toward an upper part of a plane 1c of a support 1. Therefore, it is preferable that the concave portion 2 of the support 1 and the opening portion 13 of the semiconductor device 20 should be formed in an identical shape.

Although the invention made by the inventor has been specifically described above based on the exemplary embodiments, the invention is not restricted to the exemplary embodiments but it is apparent that various changes can be made without departing from the scope thereof.

For example, although the description has been given to the case in which the wiring layer to be the rewiring is provided on only the single side (the main surface) of the chip in the first and second exemplary embodiments, the invention can also be applied to the case in which the wiring layer is provided on both sides (the main surface and the back face) of the chip.

Although the description has been given to the case in which the chip is mounted on the support with the back face of the chip set to be the opposite surface in the first exemplary embodiment, for example, the invention can also be applied to the case in which flip chip mounting is carried out with the main surface of the chip set to be the opposite surface, for instance.

The invention is effective for a semiconductor device, particularly, a semiconductor device having a CSP structure, and more particularly, is widely utilized in a manufacturing industry for a semiconductor device having a chip stack structure.

What is claimed is:

1. A method of manufacturing a semiconductor device, comprising the steps of:
    (a) providing a support including a plane having a first region for mounting a chip thereon and a second region provided around the first region;
    (b) forming an insulating resin layer in a semi-curing state on the plane;
    (c) forming, on the insulating resin layer, a first opening portion for exposing the first region, the first opening portion formed to have a size smaller than that of the chip to be mounted on the first region;
    (d) fitting the chip in the first opening portion to mount the chip on the first region in such a manner that a side surface of the insulating resin layer which defines the first opening portion directly contacts a side surface of the chip; and
    (e) completely curing the insulating resin layer after the step (d).

2. The method according to claim 1, wherein
    step (a) further includes forming a concave portion in the second region and forming a columnar conductive layer extended from the concave portion toward an upper part of the plane, and
    step (b) further includes forming the insulating resin layer in the semi-curing state on the plane to envelop a side surface of the conductive layer.

3. The method according to claim 2, wherein the step (a) further includes:

(a1) forming a conductive film on an inner part of the concave portion and on the plane;
(a2) forming a second insulating layer on the conductive film;
(a3) forming, on the second insulating layer, a hole portion for exposing the conductive film in a position of the concave portion; and
(a4) forming the conductive layer on the conductive film of the hole portion by a plating method.

4. The method according to claim 2, wherein the columnar conductive layer is formed by a plating method.

5. The method according to claim 2, wherein the columnar conductive layer is formed by inserting a conductive pin into the concave portion.

6. The method according to claim 2, further comprising the step of:
(f) separating the support from the chip, the conductive layer, and the insulating resin layer.

7. A method of manufacturing a semiconductor device, comprising the steps of:
(a) providing a support including a plane having a first region for mounting a chip thereon and a second region provided around the first region;
(b) forming a concave portion in the second region;
(c) forming a columnar conductive layer extended from the concave portion toward an upper part of the plane;
(d) forming an insulating resin layer in a semi-curing state on the plane to envelop a side surface of the conductive layer;
(e) forming, on the insulating resin layer, a first opening portion for exposing the first region;
(f) fitting a chip in the first opening portion to mount the chip on the first region with the plane and a back face of the chip provided in contact with each other;
(g) completely curing the insulating resin layer after the step (f);
(h) forming a first insulating layer on the plane to cover the conductive layer and the chip;
(i) forming, on the first insulating layer, a second opening portion and a third opening portion which expose the conductive layer and a connecting terminal on a surface of the chip respectively;
(j) forming, on the first insulating layer and inner parts of the second opening portion and the third opening portion, a wiring layer for electrically connecting the connecting terminal and the conductive layer; and
(k) separating the support from the chip, the conductive layer and the insulating resin layer.

8. The method according to claim 7, wherein the step (c) further includes:
(c1) forming a conductive film on an inner part of the concave portion and on the plane;
(c2) forming a second insulating layer on the conductive film;
(c3) forming, on the second insulating layer, a hole portion for exposing the conductive film in a position of the concave portion; and
(c4) forming the conductive layer on the conductive film of the hole portion by a plating method.

9. The method according to claim 7, wherein a shape of the concave portion is identical to a shape of the second opening portion.

10. The method according to claim 8, wherein a shape of the concave portion is identical to a shape of the second opening portion.

11. The method according to claim 7 further comprising the steps of:
(l) forming an insulating bonding layer on the first insulating layer to expose the wiring layer of the second opening portion and embed the third opening portion;
(m) repeating the steps (a) to (l) to form a first semiconductor device and a second semiconductor device; and
(n) contacting a back face of a chip of the first semiconductor device with a bonding layer of the second semiconductor device and fitting a tip portion of a conductive layer of the first semiconductor device in a second opening portion of the second semiconductor device, thereby stacking the first semiconductor device and the second semiconductor device.

12. The method according to claim 8 further comprising the steps of:
(l) forming an insulating bonding layer on the first insulating layer to expose the wiring layer of the second opening portion and embed the third opening portion;
(m) repeating the steps (a) to (l) to form a first semiconductor device and a second semiconductor device; and
(n) contacting a back face of a chip of the first semiconductor device with a bonding layer of the second semiconductor device and fitting a tip portion of a conductive layer of the first semiconductor device in a second opening portion of the second semiconductor device, thereby stacking the first semiconductor device and the second semiconductor device.

13. A method of manufacturing a semiconductor device, comprising the steps of:
(a) providing a support including a plane having a first region for mounting a chip thereon and a second region provided around the first region;
(b) forming a concave portion in the second region;
(c) forming a columnar conductive layer extended from the concave portion toward an upper part of the plane;
(d) forming an insulating resin layer in a semi-curing state on the plane to envelop a side surface of the conductive layer;
(e) forming, on the insulating resin layer, a first opening portion for exposing the first region;
(f) fitting a chip in the first opening portion to mount the chip on the first region with the plane and a back face of the chip provided in contact with each other; and
(g) completely curing the insulating resin layer after the step (f).

14. The method according to claim 13, wherein the step (c) further includes:
(c1) forming a conductive film on an inner part of the concave portion and on the plane;
(c2) forming a second insulating layer on the conductive film;
(c3) forming, on the second insulating layer, a hole portion for exposing the conductive film in a position of the concave portion; and
(c4) forming the conductive layer on the conductive film of the hole portion by a plating method.

15. The method according to claim 14, wherein a shape of the concave portion is identical to a shape of the second opening portion.

16. The method according to claim 13, wherein a shape of the concave portion is identical to a shape of the second opening portion.

17. The method according to claim 13, wherein the columnar conductive layer is formed by a plating method.

18. The method according to claim 13, wherein the columnar conductive layer is formed by inserting a conductive pin into the concave portion.

19. The method according to claim 13, further comprising the step of:
(f) separating the support from the chip, the conductive layer, and the insulating resin layer.

* * * * *